(12) United States Patent
Ikeda et al.

(10) Patent No.: US 7,556,899 B2
(45) Date of Patent: Jul. 7, 2009

(54) SYSTEM FOR CONTROLLING AN OVERLAY, METHOD FOR CONTROLLING OVERLAY, AND METHOD FOR MANUFACTURING A SEMICONDUCTOR DEVICE

(75) Inventors: Makoto Ikeda, Kanagawa (JP); Shoichi Harakawa, Kanagawa (JP); Takuya Kono, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 659 days.

(21) Appl. No.: 11/389,114

(22) Filed: Mar. 27, 2006

(65) Prior Publication Data

US 2006/0265686 A1 Nov. 23, 2006

(30) Foreign Application Priority Data

Mar. 29, 2005 (JP) ............................ P2005-096186

(51) Int. Cl.
*G03F 9/00* (2006.01)
*G06F 19/00* (2006.01)

(52) U.S. Cl. ............................ 430/22; 430/30; 382/151; 700/121; 716/19

(58) Field of Classification Search .................... 430/22, 430/30; 382/144, 145, 151; 438/14; 700/90, 700/95, 117, 121; 716/19, 21
See application file for complete search history.

(56) References Cited

U.S. PATENT DOCUMENTS

| | | | | |
|---|---|---|---|---|
| 4,958,160 A | * | 9/1990 | Ito et al. ........................ 355/53 |
| 6,023,338 A | * | 2/2000 | Bareket ........................ 356/401 |
| 6,092,031 A | * | 7/2000 | Yasuda ........................ 702/94 |
| 6,127,075 A | * | 10/2000 | Hsu ............................ 430/30 |
| 6,218,200 B1 | * | 4/2001 | Chen et al. .................... 438/14 |
| 6,338,971 B1 | * | 1/2002 | Yasuda et al. ................. 438/14 |
| 6,405,096 B1 | * | 6/2002 | Toprac et al. ................. 700/121 |
| 6,622,061 B1 | * | 9/2003 | Toprac et al. ................. 700/121 |
| 6,826,743 B2 | * | 11/2004 | Park et al. ..................... 716/21 |
| 6,853,440 B1 | * | 2/2005 | Van De Pasch et al. ....... 355/53 |
| 7,031,794 B2 | * | 4/2006 | Cheng et al. ................. 700/121 |
| 2005/0071033 A1 | | 3/2005 | Cheng et al. |

FOREIGN PATENT DOCUMENTS

JP  11-260683  9/1999

* cited by examiner

*Primary Examiner*—Christopher G Young
(74) *Attorney, Agent, or Firm*—Finnegan, Henderson, Farabow, Garrett & Dunner, L.L.P.

(57) ABSTRACT

A system for controlling an overlay includes a processing data receiving module receiving a processing data string describing a name of an exposure process for a target layer and an original control set value of overlays between the target layer and underlying layers below the target layer; an inspection data receiving module receiving inspection data strings describing names of inspection processes and inspection values determined by the inspection processes inspecting respective overlays between the target layer and the underlying layers; a data combining module combining the processing data string and each of the inspection data strings using a combining condition table so as to create a correction data table; and a control set value calculation module calculating a corrected control set value based on the inspection values of the correction data table.

20 Claims, 8 Drawing Sheets

| EXPOSURE TOOL | LOT NUMBER | EXPOSURE PROCESS | CONTROL SET VALUE |
|---|---|---|---|
| Litho#1 | 0005 | L3PHOT | 0.1 |

FIG. 5

| LOT NUMBER | INSPECTION PROCESS | INSPECTION VALUE |
|---|---|---|
| 0005 | L2L3OL | −0.005 |
| 0005 | L1L3OL | 0.003 |

FIG. 6

| EXPOSURE PROCESS | INSPECTION PROCESS |
|---|---|
| L3PHOT | L2L3OL |
| L3PHOT | L1L3OL |

FIG. 7

| EXPOSURE TOOL | LOT NUMBER | EXPOSURE PROCESS | INSPECTION PROCESS | CONTROL SET VALUE | INSPECTION VALUE |
|---|---|---|---|---|---|
| Litho#1 | 0005 | L3PHOT | L2L3OL | 0.1 | −0.005 |
| Litho#1 | 0005 | L3PHOT | L1L3OL | 0.1 | 0.003 |

| LOT NUMBER | INSPECTION PROCESS | INSPECTION VALUE x | INSPECTION VALUE y |
|---|---|---|---|
| 0005 | L2L30L | 0.005 | 0.006 |
| 0005 | L1L30L | 0.007 | 0.008 |

FIG. 16

| EXPOSURE TOOL | LOT NUMBER | EXPOSURE PROCESS | INSPECTION PROCESS | CONTROL SET VALUE x | CONTROL SET VALUE y | INSPECTION VALUE x | INSPECTION VALUE y |
|---|---|---|---|---|---|---|---|
| Litho#1 | 0005 | L3PHOT | L2L30L | 0.1 | 0.2 | 0.005 | 0.006 |
| Litho#1 | 0005 | L3PHOT | L2L30L | 0.1 | 0.2 | 0.007 | 0.008 |

FIG. 17

| INSPECTION PROCESS | REFERENCE VALUE x | REFERENCE VALUE y |
|---|---|---|
| L2L30L | NULL | 50nm |
| L1L30L | 100nm | NULL |

FIG. 18

SYSTEM FOR CONTROLLING AN OVERLAY, METHOD FOR CONTROLLING OVERLAY, AND METHOD FOR MANUFACTURING A SEMICONDUCTOR DEVICE

CROSS REFERENCE TO RELATED APPLICATIONS AND INCORPORATION BY REFERENCE

This application is based upon and claims the benefit of priority from prior Japanese Patent Application P2005-096186 filed on Mar. 29, 2005; the entire contents of which are incorporated by reference herein.

BACKGROUND OF THE INVENTION

1. Field of the Invention

The present invention relates to photolithography, and particularly to an overlay control system and an overlay control method for an exposure tool, and a manufacturing method for a semiconductor device.

2. Description of the Related Art

In the manufacture of semiconductor devices and the like, a plurality of material layers are formed atop a semiconductor substrate by a plurality of processes. For example, in photolithography, a mask pattern of a process target layer is transferred onto a resist film coated on the semiconductor substrate. The mask pattern of the process target layer is aligned with an underlying pattern formed in an underlying layer. In order to ensure overlay accuracy with respect to the underlying layer, a control set value is assigned to an exposure tool so as to control an overlay for alignment of the mask pattern with the underlying pattern.

In controlling a typical overlay, an overlay correction value is used as a control set value of an exposure tool (refer to Japanese Unexamined Patent Application Publication No. H11-260683). The overlay correction value is calculated based on a result of an overlay inspection carried out to an underlying layer as an overlay target. In controlling a typical overlay, the overlay accuracy to the overlay target underlying layer can be improved. However, it is impossible to satisfy the overlay accuracy with respect to other underlying layers simultaneously. In addition, the overlay accuracy may be defined with respect to each direction orthogonal to one another, for example, an X direction and a Y direction, depending on the structure of the semiconductor device. In a case in which the overlay accuracy of each of the X and the Y directions is defined independently with respect to different underlying layers, the typical overlay control cannot be utilized.

SUMMARY OF THE INVENTION

A first aspect of the present invention inheres in a system for controlling an overlay including a processing data receiving module configured to receive a processing data string from an exposure tool, the processing data string describing a name of an exposure process for a target layer and an original control set value of overlays between a target pattern in the target layer and underlying patterns in a plurality of underlying layers below the target layer; an inspection data receiving module configured to receive a plurality of inspection data strings from an overlay inspection tool, the inspection data strings describing a plurality of names of a plurality of inspection processes and a plurality of inspection values determined by the inspection processes, the inspection processes inspecting respective overlays between the target pattern and the underlying patterns; a data combining module including a combining condition table configured to combine the processing data string and each of the inspection data strings so as to create a correction data table, the combining condition table describing a relationship between the exposure process and each of the inspection processes; and a control set value calculation module configured to calculate a corrected control set value based on the inspection values of the correction data table.

A second aspect of the present invention inheres in a method for controlling an overlay including sequentially delineating a plurality of underlying patterns of underlying layers below a target layer; obtaining a processing data string from a processing information database, the processing data string describing a name of an exposure process for the target layer and an original control set value of overlays by an exposure tool between a target pattern in the target layer and the underlying patterns in the underlying layers; obtaining a plurality of inspection data strings from an inspection information database, the inspection data strings describing a plurality of names of a plurality of inspection processes and a plurality of inspection values determined by the inspection processes, the inspection processes inspecting respective overlays between the target pattern and the underlying patterns; creating a correction data table by combining the processing data string and each of the inspection data strings using a combining condition table, the combining condition table describing a relationship between the exposure process and each of the inspection processes; and calculating a corrected control set value of the exposure tool based on the inspection values of the correction data table.

A third aspect of the present invention inheres in a method for manufacturing a semiconductor device including sequentially delineating a plurality of underlying patterns of underlying layers below a target layer on a reference semiconductor substrate; inspecting an overlay between the target layer and each of the underlying layers; providing a corrected control set value by: obtaining a processing data string describing a name of an exposure process for the target layer and an original control set value of overlays by an exposure tool between a target pattern in the target layer and the underlying patterns in the underlying layers; obtaining a plurality of inspection data strings describing a plurality of names of a plurality of inspection processes and a plurality of inspection values determined by the inspection processes, the inspection processes inspecting respective overlays between the target and the underlying patterns; creating a correction data table by combining the processing data string and each of the inspection data strings using a combining condition table, the combining condition table describing a relationship between the exposure process and each of the inspection processes; and calculating the corrected control set value of the exposure tool based on the inspection values of the correction data table; sequentially delineating the underlying patterns in respective underlying layers on the target semiconductor substrate; and transferring a pattern of the target layer onto the target semiconductor substrate by the exposure tool, using the corrected control set value.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 1:
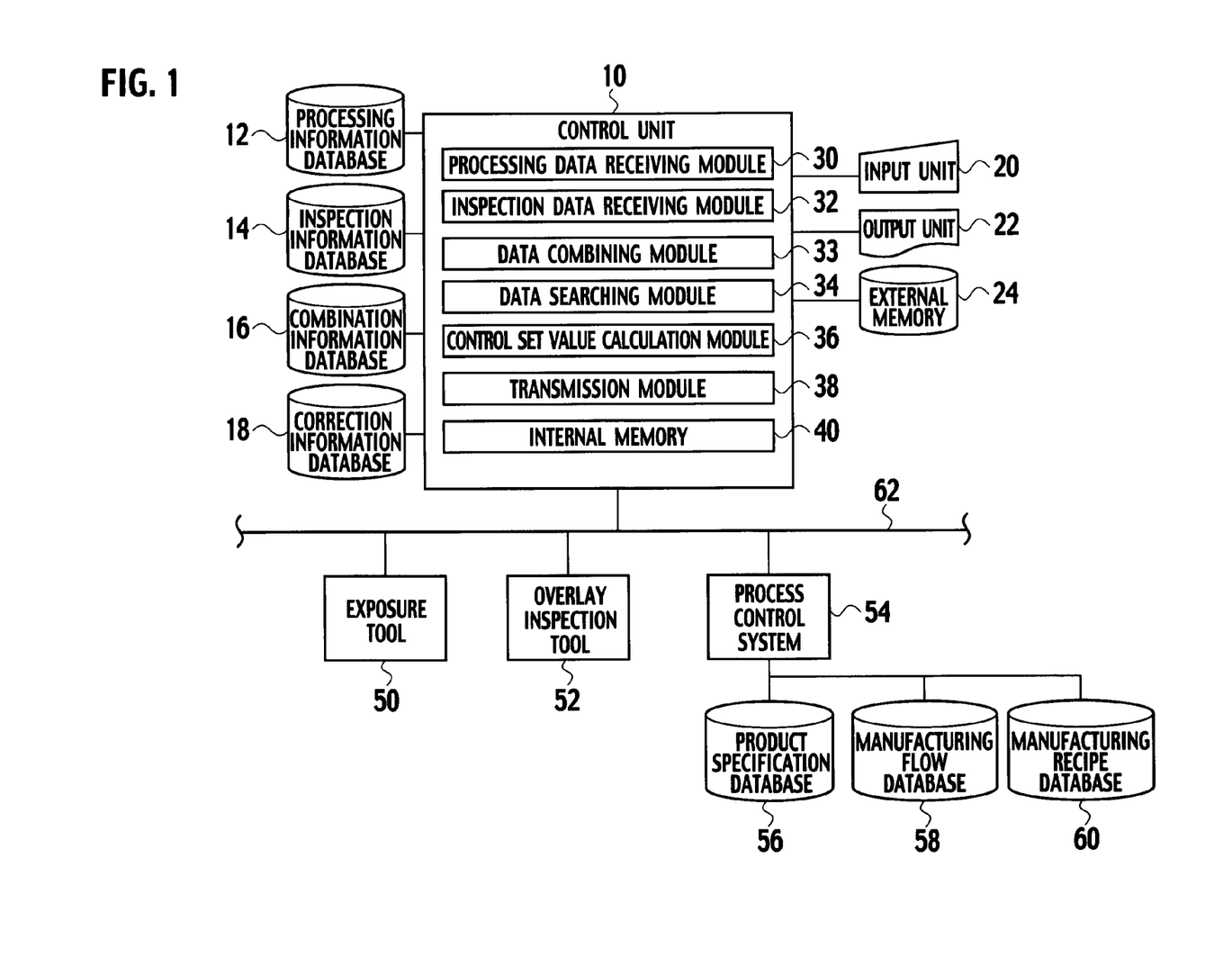
FIG. 1 is a schematic view showing an example of a configuration of a system for controlling an overlay according to a first embodiment of the present invention.

As shown in FIG. 1, a system for controlling an overlay according to a first embodiment of the present invention includes a control unit 10, a processing information database 12, an inspection information database 14, a combination information database 16, a correction information database 18, an input unit 20, an output unit 22, an external memory 24, and the like. The control unit 10 includes a processing data receiving module 30, an inspection data receiving module 32, a data combining module 33, a data searching module 34, a control set value calculation module 36, a transmission module 38, an internal memory 40, and the like. An exposure tool 50, an overlay inspection tool 52, a process control system 54, and the like, are connected to the control unit 10 by way of a communication line 62, such as a local area network (LAN). A product specification database 56, a manufacturing flow database 58, a manufacturing recipe database 60 and the like, are connected to the process control system 54.

The control unit 10 receives a processing data string from the processing information database 12, which describes an exposure process name for an exposure processing of a target layer, and a control set value of overlays by the exposure tool 50 between the target layer and a plurality of underlying layers below the target layer. Additionally, the control unit 10 receives a plurality of inspection data strings from the inspection information database 14, which describe a plurality of inspection process names to inspect an overlay between the target layer and each of the plurality of underlying layers, and a plurality of inspection values obtained from each inspection process. The exposure process name is obtained by searching a combining condition table which describes a relationship between the exposure process and the inspection process. The processing data string and the inspection data strings are respectively obtained using the exposure process name and the inspection process names. A correction data table is created by combining the processing data string and the plurality of inspection data strings. A corrected control set value is calculated based on the plurality of inspection values of the correction data table.

The control unit 10 may be part of a central processing unit (CPU) of a general purpose computer system. The processing data receiving module 30, the inspection data receiving module 32, the data combining module 33, the data searching module 34, the control set value calculation module 36, and the transmission module 38 maybe discrete hardware, or maybe provided by virtually equivalent functions achieved by software, using the CPU of the general purpose computer system.

The exposure tool 50 is used in an exposure process for manufacturing a semiconductor device. The overlay inspection tool 52 is used in an inspection process for inspecting an overlay between a pattern of a layer delineated in the exposure process and a pattern of an underlying layer. The process control system 54 controls the exposure process and the inspection process, based on design specifications of a semiconductor device, such as a product specification, a manufacturing flow, and a manufacturing recipe, which are stored in the product specification database 56, the manufacturing flow database 58, and the manufacturing recipe database 60, respectively.

Figure 2:
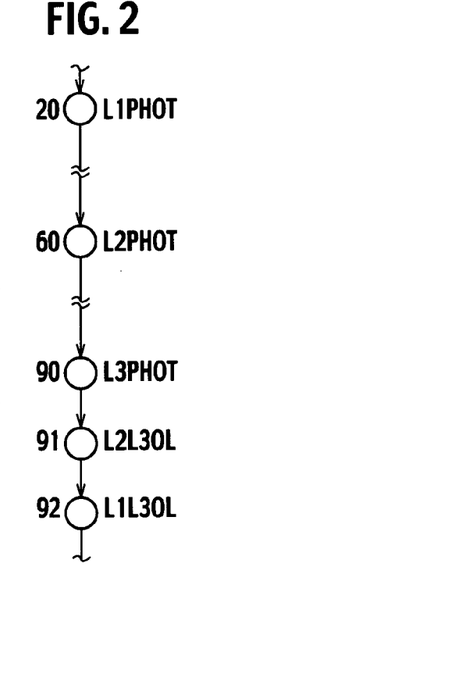
FIG. 2 is a view showing an example of a manufacturing process flow for a semiconductor device, used for explaining the first embodiment of the present invention.

In the flow of a manufacturing process of a semiconductor device, as shown in FIG. 2, exposure process names L1PHOT, L2PHOT, and L3PHOT of respective layers L1, L2, and L3 are described at identification numbers ID20, ID60, and ID90, respectively. In addition, after the exposure process of the layer L3, inspection process names L2L3OL and L1L3OL of respective overlays between the layers L2 and L3, and between the layers L1 and L3 are described at identification numbers ID91 and ID92 in the manufacturing process.

Figure 3:
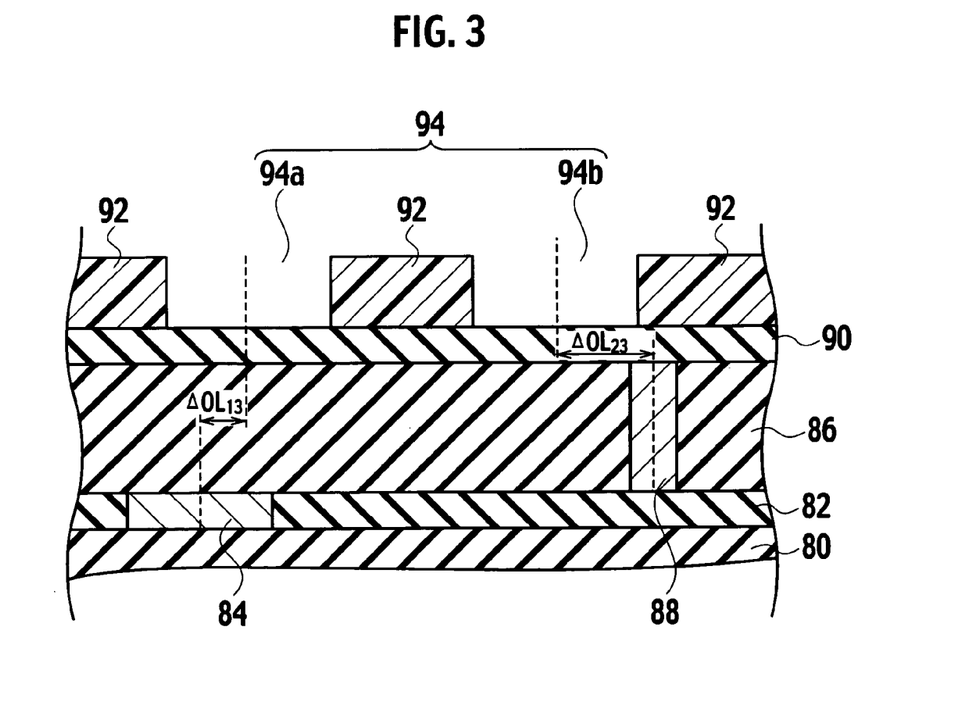
FIG. 3 is a cross sectional view showing an example of a semiconductor device, used for explaining the first embodiment of the present invention.

For example, as shown in FIG. 3, a first pattern 84, such as an interconnect, in a first insulation film 82 on an underlying layer 80, such as an insulating film, is formed as a pattern of the layer L1 by the exposure process of the layer L1 (hereinafter referred to as "L1 exposure process"). A second pattern 88, such as a plug, in a second insulation film 86 on the layer L1 is formed as a pattern of the layer L2 by the exposure process of the layer L2 (hereinafter referred to as "L2 exposure process"). A third pattern 94 having openings 94a and 94b in a resist film 92 on a surface of an insulation film 90, deposited on the layer L2, is formed as a pattern of the layer L3 by the exposure process of the layer L3 (hereinafter referred to as "L3 exposure process") In the inspection process of an overlay between the layers L3 and L2 (hereinafter referred to as "L2L3 inspection process"), a shift ΔOL23 between the center locations of the opening 94b and the second pattern 88 is measured by the overlay inspection tool 52 as an inspection value of an overlay variation. In the inspection process of an overlay between the layers L3 and L1 (hereinafter referred to as "L1L3 inspection process"), a shift ΔOL13 between the center locations of the opening 94a and the first pattern 84 is measured as an inspection value of an overlay variation. For example, the inspection value of the shift ΔOL23 is −0.005, and the inspection value of the shift ΔOL13 is 0.003.

A shift between the center locations of the patterns has been described as the inspection value of the overlay variation between a delineated pattern and an underlying pattern for an illustrative purpose. However, the inspection value is not so limited. For example, a X direction shift (shift X), a Y direction shift (shift Y), a X direction scaling (scaling X), a Y direction scaling (scaling Y), a rotation, an orthogonality, and the like, maybe included as overlay variations. The smaller the inspection value, the higher the overlay accuracy.

Figure 4:
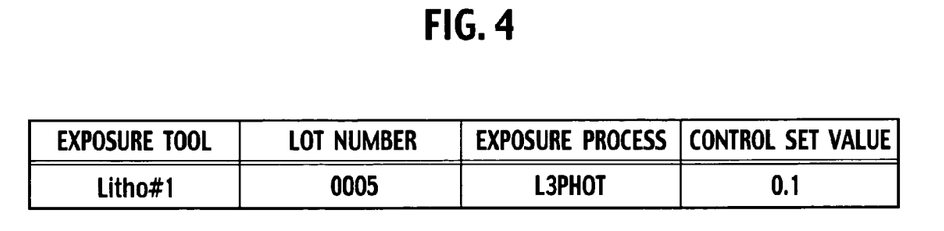
FIG. 4 is a view showing an example of processing data according to the first embodiment of the present invention.

The processing information database 12 stores the processing data string and the like of the exposure process carried out by the exposure tool 50. In the processing data string, a name of an exposure tool used in the exposure process, a lot number of a semiconductor device processed in the exposure process, an exposure process name, a control set value (recipe) used for controlling the exposure tool, and the like, are described. For example, as shown in FIG. 4, an exposure tool name "Litho#1", a lot number "0005", an exposure process name "L3PHOT", a control set value "0.1", and the like, are described in the processing data string. In addition, the control set value is assigned to the exposure tool in order to control an overlay variation in the exposure processing. Although a single control set value has been described in FIG. 4, the number of control set values is not limited. For example, correction values of the exposure processing, such as the shift X, the shift Y, a X direction magnification (magnification X), a Y direction magnification (magnification Y), the rotation, and a skew, corresponding to the inspection values, are included in the control set values.

Figure 5:
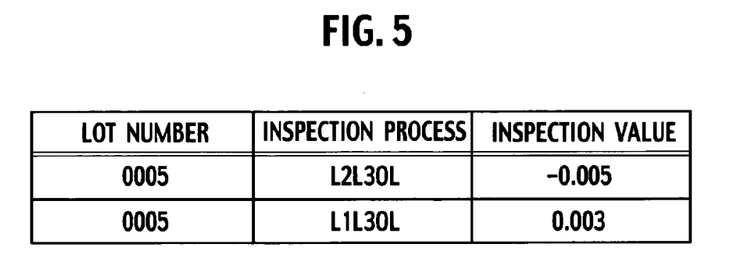
FIG. 5 is a view showing an example of inspection data according to the first embodiment of the present invention.

The inspection information database 14 stores overlay inspection data and the like determined by the overlay inspection tool 52. The lot number, the overlay inspection process name, the inspection value of the overlay variation, and the like are described in the inspection data strings. For example, as shown in FIG. 5, the inspection process names "L2L3OL", "L1L3OL", and the inspection values "−0.005", "0.003", and the like, are described with respect to the lot number "0005".

Figure 6:
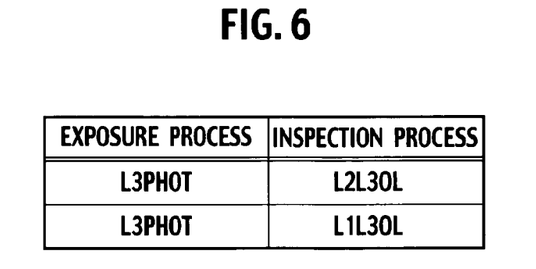
FIG. 6 is a view showing an example of a combination condition according to the first embodiment of the present invention.

The combination information database 16 stores the combining condition table that defines relations between the exposure processes and the inspection processes, respectively carried out by the exposure tool 50 and the overlay inspection tool 52. For example, as shown in FIG. 6, the inspection process names "L2L3OL", and "L1L3OL" are described with respect to the exposure process name "L3PHOT". In other words, the inspection processes L2L3 and L1L3 are defined as the inspection processes for the L3 exposure process.

Figure 7:
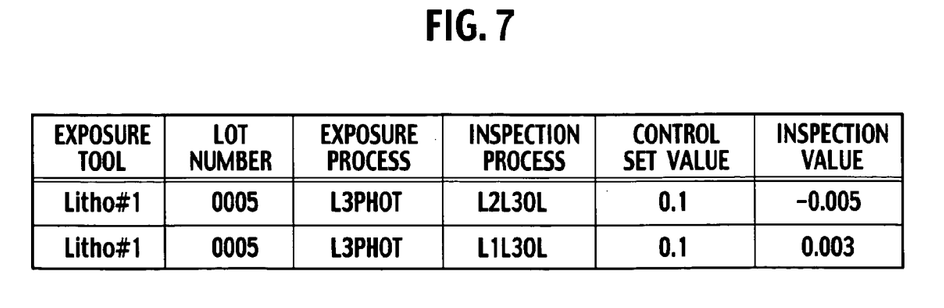
FIG. 7 is a view showing an example of correction data according to the first embodiment of the present invention.

Additionally, the correction information database 18 stores the correction data table, which has related the processing data string to the inspection data strings. For example, as shown in FIG. 7, the inspection process names "L2L3OL" and "L1L3OL", the control set value "0.1", the inspection values of "−0.005" and "0.003", and the like, are described with respect to the exposure tool name "Litho#1", the lot number "0005" and the exposure process name "L3PHOT".

The processing data receiving module 30 of the control unit 10 receives the processing data string, shown in FIG. 4, from the exposure tool 50. The processing data string is registered in the processing information database 12. The inspection data receiving module 32 receives the inspection data strings shown in FIG. 5 from the overlay inspection tool 52. Each inspection data string is registered in the inspection information database 14.

The data combining module 33 searches the combination information database 16 for the inspection process name of the inspection data string received by the inspection data receiving module 32, so as to obtain the exposure process name described in the combining condition table shown in FIG. 6. The data combining module 33 searches the processing information database 12 for the lot number and the obtained exposure process name, while simultaneously searching the inspection information database 14 for the lot number and the inspection process name. The data combining module 33 relates the obtained processing data string to the inspection data string, to be registered in the correction information database 18 as the correction data table shown in FIG. 7.

The data searching module 34 searches the combination information database 16 for the exposure process name that is a correction target, to obtain the inspection process name. The data searching module 34 further searches the correction information database 18 for the exposure process name and the obtained inspection process name, to obtain the correction data table.

The control set value calculation module 36 calculates the corrected control set value based on the control set value and the inspection value described in the obtained correction data table.

The transmission module 38 transmits the corrected control set value calculated by the control set value calculation module 36 to the exposure tool 50.

The internal memory 40 stores a program instruction for a variety of arithmetic processing, which is loaded by the control unit 10. The internal memory 40 temporarily stores data obtained during a calculation and an analysis thereof during the operation of the control unit 10.

The input unit 20 refers to devices such as a keyboard and a mouse. When an input operation is performed from the input unit 20, corresponding key information is transmitted to the control unit 10. The output unit 22 includes a screen monitor, such as a liquid crystal display (LCD), a light emitting diode (LED) panel, an electroluminescent (EL) panel and the like. The output unit 22 displays the processing data string and the inspection data strings transmitted from the exposure tool 50 and the overlay inspection tool 52, the correction data table processed by the control unit 10, and the calculation result of the corrected control set value determined by the control unit 10.

The external memory 24 stores the program instruction for each processing executed by the control unit 10. According to processing requirements, the program instruction is read into the control unit 10, and the arithmetic processing is executed. The external memory 24 can be constructed by an auxiliary memory device, such as a magnetic disk device, a magnetic drum device, a magnetic tape device, a semiconductor memory device including a semiconductor ROM, a semiconductor RAM and the like. The external memory 24 may also be constructed by a primary storage unit of a CPU of a computer.

In the first embodiment, for example, the corrected control set value is calculated by the control set value calculation module 36 as shown below. First, a virtual inspection value D is calculated using the following equation.

$$D=(A+B)/2 \qquad (1)$$

Here, "A" is the inspection value of the L2L3 inspection process, and "B" is the inspection value of the L1L3 inspection process. The virtual inspection value D is defined as an average of the inspection values A and B.

A corrected control set value E may be calculated from the virtual inspection value D using the following equation.

$$E=C-D \qquad (2)$$

Here, the value C depicted above represents the control set value used in the L3 exposure process. For example, from the equation (1) using the correction data table shown in FIG. 7, the virtual inspection value D is calculated as being about −0.001. From the equation (2), the corrected control set value is calculated as being about 0.101. The corrected control set value is transmitted back to the exposure tool 50, and the manufacturing process for a semiconductor device of the next lot is carried out.

Figure 8:
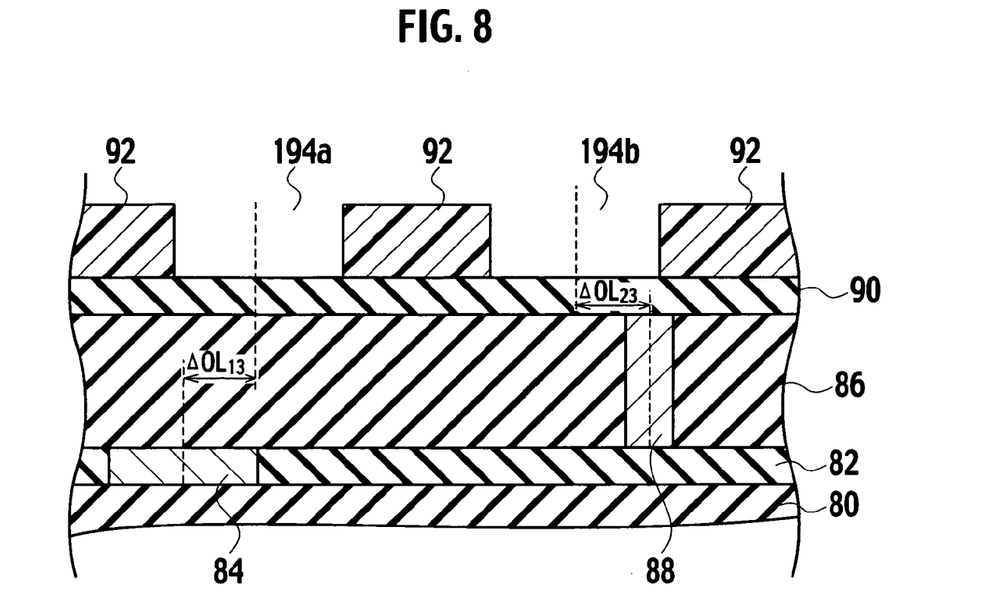
FIG. 8 is a cross sectional view showing an example of overlay control according to the first embodiment of the present invention.

For example, using the corrected control set value calculated by the overlay control system according to the first embodiment, the L3 exposure process of the next lot is carried out by the exposure tool 50 following the manufacturing steps shown in FIG. 2. As shown in FIG. 8, a shift ΔOL23 between an opening 194b and the second pattern 88, and a shift ΔOL13 between an opening 194a and the first pattern 84 are inspected by the overlay inspection tool 52 in the L2L3 and L1L3 inspection processes, respectively. The inspection value of the shift ΔOL23 is about −0.004, and the inspection value of the shift ΔOL13 is about 0.004. In this manner, the absolute value of the shift becomes approximately uniform.

Figure 9:
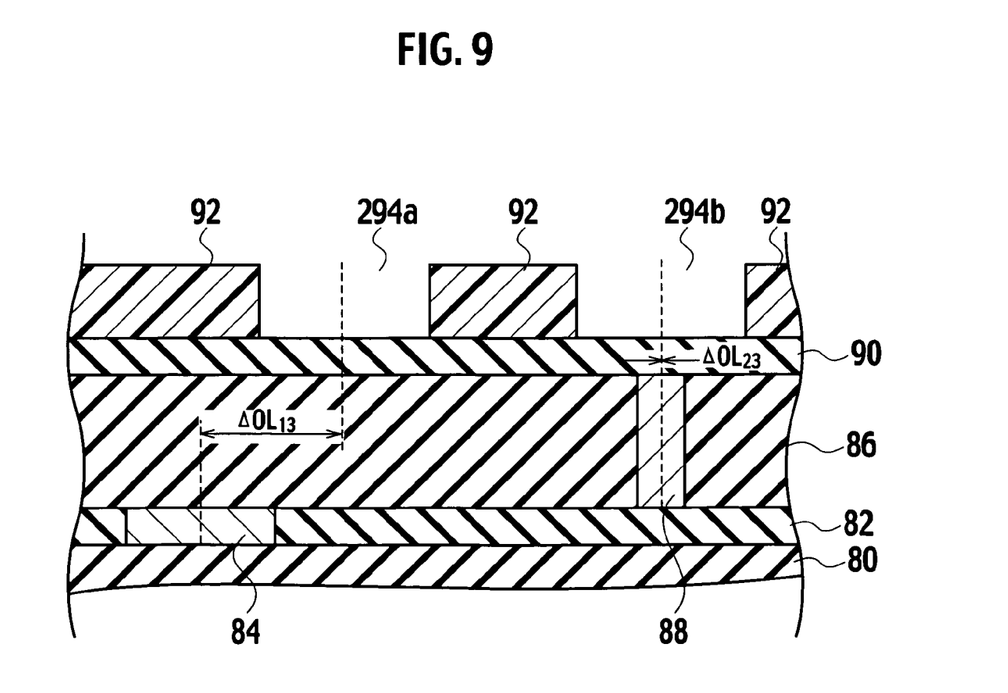
FIG. 9 is a cross sectional view showing an example of overlay control according to a comparative example.

As a comparative example, using only the inspection value of the shift ΔOL23 between an opening 294b and the second pattern 88, the corrected control set value has been calculated. As shown in FIG. 9, according to the comparative example, it is possible to provide the inspection value of the shift ΔOL23 between the opening 294b and the second pattern 88 to be approximately zero. However, the inspection value of the shift ΔOL13 between an opening 294a and the first pattern 84 increases to about 0.008.

Thus, in the first embodiment, the corrected control set value is calculated using the mean value of the overlay inspection values A, B between the third pattern 94, and the second and first patterns 88, 84, respectively, shown in FIG. 3, as the virtual inspection value. As a result, in the overlay control system according to the first embodiment, it is possible to simultaneously ensure the overlay accuracy of the pattern of the layer L3 to the patterns of the layers L2 and L3.

Figure 10:
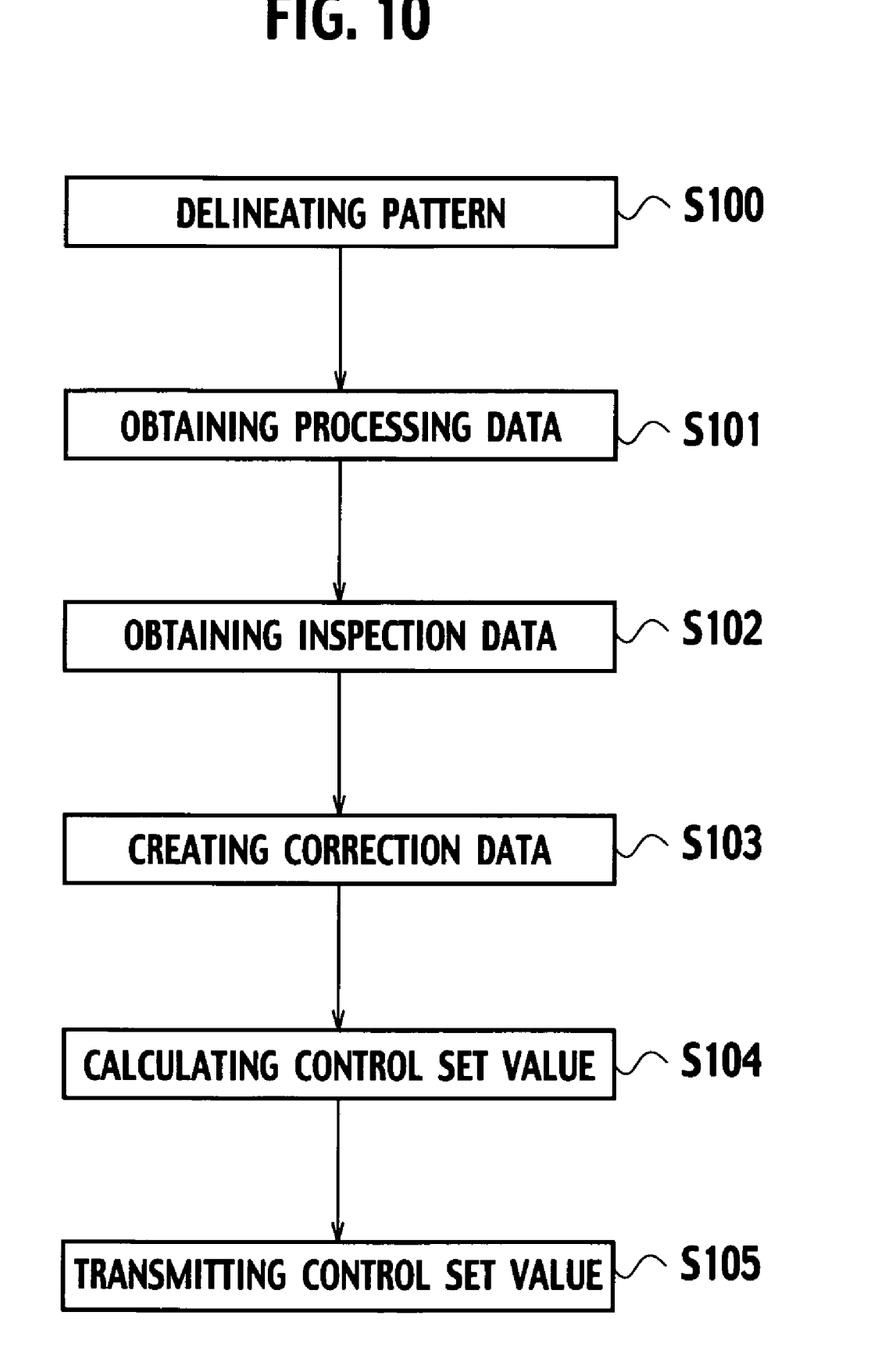
FIG. 10 is a flowchart showing an example of a method for controlling an overlay according to the first embodiment of the present invention.

Next, a method for controlling an overlay according to the first embodiment of the present invention will be described with reference to the flowchart shown in FIG. 10.

The manufacture of a semiconductor device using a semiconductor substrate (reference semiconductor substrate) of the lot number 0005 is carried out following the manufacturing process flow shown in FIG. 2. The first pattern 84 of the layer L1 and the second pattern 88 of the layer L2 shown in FIG. 3 are delineated in the first and second insulation films 82 and 86, respectively, on the underlying layer 80. The insulation film 90 is deposited on the second insulation film 86.

In step S100, the L3 exposure process is carried out using the exposure tool 50. The L3 exposure process delineates the third pattern 94 of the layer L3 which includes the openings 94a and 94b in the resist film 92 that is coated on the insulation film 90. The processing data string shown in FIG. 4 is received from the exposure tool 50 by the processing data receiving module 30 of the control unit 10 shown in FIG. 1 and stored in the processing information database 12 at the end of the L3 exposure process.

In step S101, the L2L3 inspection process is carried out using the overlay inspection tool 52 to inspect the overlay between the layer L2 and the layer L3. The L1L3 inspection process is carried out using the overlay inspection tool 52 to inspect the overlay between the layer L1 and the layer L3. Each inspection data string shown in FIG. 5 is received from the overlay inspection tool 52 by the inspection data receiving module 32 and stored in the inspection information database 14 at the end of each of the L2L3 and L1L3 inspection processes.

In step S102, the combination information database 16 that stores the combining condition table defining the relations between the exposure process and the inspection process shown in FIG. 6, is searched, by the data combining module 33, for the inspection process names L2L3OL and L1L3OL received by the inspection data receiving module 32, so as to obtain the exposure process name L3PHOT. The processing information database 12 and the inspection information database 14 are searched respectively for the lot number 0005, and the exposure process name L3PHOT and the inspection process names L2L3OL, L1L3OL. The obtained processing and inspection data strings are combined, by the data combining module 33, so as to create the correction data table shown in FIG. 7 and to store the correction data table in the correction information database 18.

In step S103, the combination information database 16 is searched, by the data searching module 34, for the exposure process name L3PHOT to obtain the inspection process names L2L3OL, L1L3OL. The correction information database 18 is searched for the inspection process names L2L3OL, L1L3OL to obtain the correction data table.

In step S104, the corrected control set value is calculated, by the control set value calculation module 36, based on the control set value of the L3 exposure process described in the correction data table, and the inspection value of the inspection process names L2L3L and L1L3OL.

In step S105, the corrected control set value is transmitted to the exposure tool 50 by the transmission module 38. Using the corrected control set value, the L3 exposure process using a semiconductor substrate (target semiconductor substrate) of the next lot is carried out by the exposure tool 50.

In the method for controlling an overlay according to the first embodiment, the corrected control set value of the L3 exposure process of the next lot is calculated based on the control set value of the L3 exposure process and the inspection value of the L2L3 and L1L3 inspection processes. As a result, it is possible to simultaneously ensure the overlay accuracy of the pattern of the layer L3 to the patterns of the layers L2 and L1.

Second Embodiment

Figure 11:
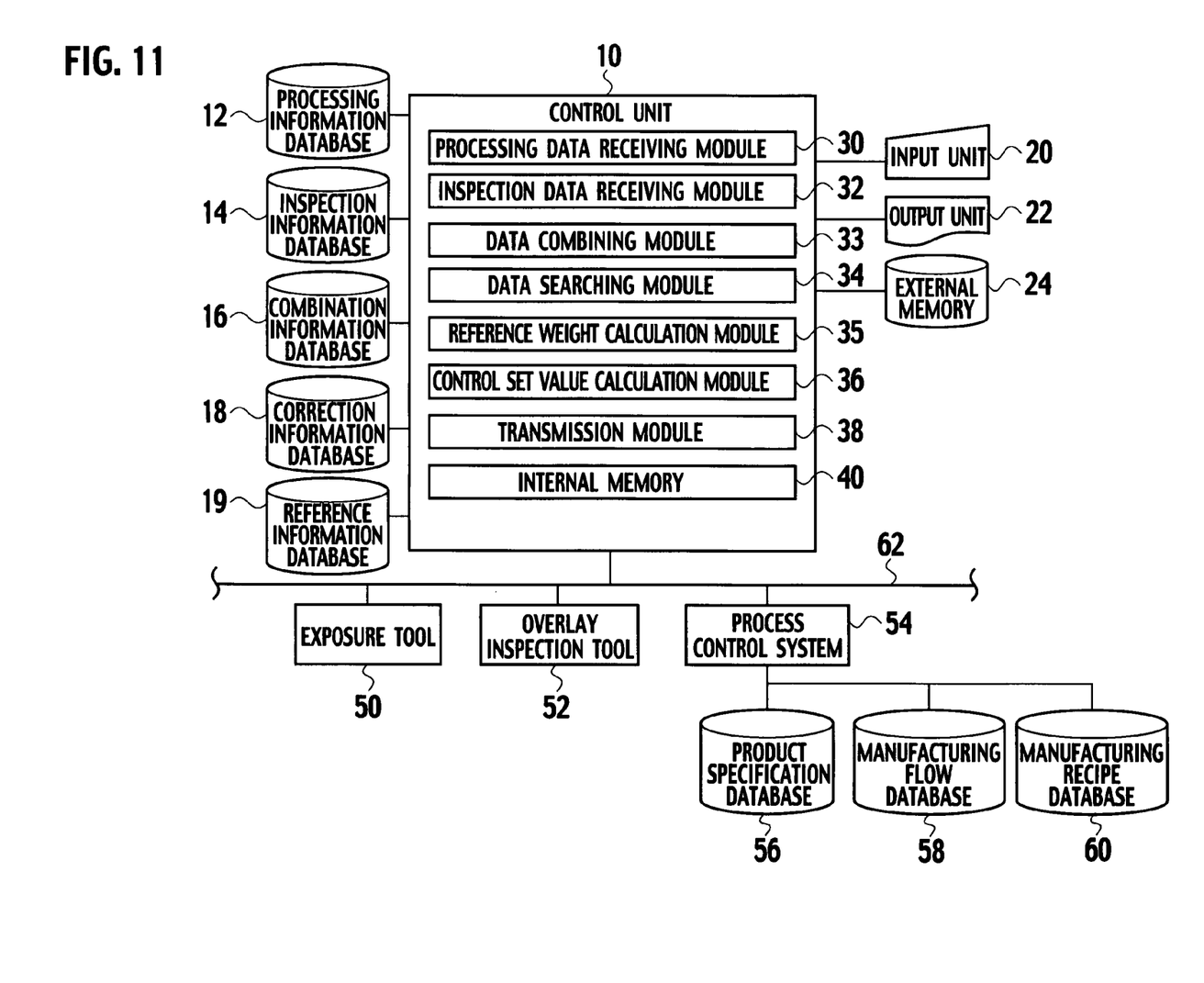
FIG. 11 is a schematic view showing an example of a configuration of a system for controlling an overlay according to a second embodiment of the present invention.

A system for controlling an overlay according to a second embodiment of the present invention, as shown in FIG. 11, includes a control unit 10a. The control unit 10a includes a reference weight calculation module 35.

Figure 12:
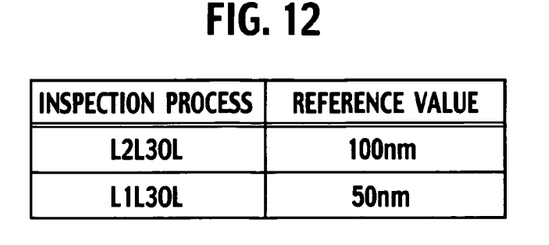
FIG. 12 is a view showing an example of a reference table according to the second embodiment of the present invention.

In the second embodiment, reference values for the guaranteed overlay accuracy differs from each underlying layer. The reference values of the overlay of each underlying layer are stored in a reference information database 19 as a reference table. For example, as shown in FIG. 12, the reference values of 100 nm and 50 nm are described in the reference table with respect to the inspection process names L2L3OL and L1L3OL, respectively. In other words, it is necessary to ensure an overlay accuracy between the layer L2 and the layer L3 (hereinafter referred to as "L2L3 reference value") within 100 nm, and an overlay accuracy between the layer L1 and the layer L3 (hereinafter referred to as "L1L3 reference value") within 50 nm.

The data searching module 34 searches the combination information database 16, for example, for the exposure process name L3PHOT, as shown in FIG. 6, so as to obtain the inspection process names L2L3OL and L1L3OL. The data searching module 34 further searches the correction information database 18 for the exposure process name L3PHOT and the obtained inspection process names L2L3OL, L1L3OL so as to obtain the correction data table.

The reference weight calculation module 35 searches the reference information database 19 for the obtained inspection process names L2L3OL, L1L3OL so as to obtain the reference value for each of the inspection process names L2L3OL and L1L3OL. Further, the reference weight calculation module 35 calculates reference weights for the respective overlay inspection values, based on the reference values. The control set value calculation module 36 calculates the corrected control set value, based on the correction data table and the reference weights.

The overlay control system according to the second embodiment is different from the first embodiment in that the reference table stored in the reference information database 19 is searched by the reference weight calculation module 35 to add the reference weight to each of the overlay inspection values. Other configurations of the second embodiment are similar to the first embodiment, so duplicated descriptions are omitted.

In the second embodiment, the overlay accuracies of 50 nm in the Y direction and 100 nm in the X direction, respectively, are ensured for the L2L3 overlay and the L1L3 overlay in the L3 exposure process. For example, the reference weight is calculated from a reciprocal of the reference value. The L2L3 reference value, the L1L3 reference value, and a summation of the reference values are denoted by j, k, and s, respectively.

$$s=j+k \quad (3)$$

Reference weights Wa and Wb, with respect to the inspection values of the L2L3 overlay and the L1L3 overlay, respectively, are defined as follows.

$$Wa=s/j \quad (4)$$

$$Wb=s/k \quad (5)$$

A summation S of the reference weights is provided as follows.

$$S=Wa+Wb \quad (6)$$

Here, a virtual inspection value D is defined by the following equation, using inspection values A and B provided by the L2L3 and L1L3 inspection processes, respectively.

$$D=(A\times Wa+B\times Wb)/S \quad (7)$$

A corrected control set value E is calculated by the equation (2) using the virtual inspection value D.

For example, using the correction data table shown in FIG. 7, and the reference table shown in FIG. 12, the virtual inspection value D is calculated from the equations (3) and (7) as being −0.0003. The corrected control set value E is calculated by the equation (2) as 0.0997. The corrected control set value E is transmitted back to the exposure tool 50, and the manufacturing process for a semiconductor device of the next lot is carried out.

In this manner, the inspection values A and B of the L2L3 and L1L3 overlays are weighted by the reference weights calculatation, based on the reciprocals of the L2L3 and L1L3 reference values, respectively. For example, as shown in FIG. 12, the L2L3 reference value is larger than the L1L3 reference value, and the reference weight Wa with respect to the inspection value A is smaller than the reference weight Wb with respect to the inspection value B. Therefore, it is possible to improve the overlay accuracy between the layers L1 and L3, which have the smaller reference value. Thus, in the overlay control system according to the second embodiment, it is possible to ensure the overlay accuracy of the pattern of the transferred layer to the underlying layer corresponding to the reference value of the guaranteed overlay accuracy.

Figure 13:
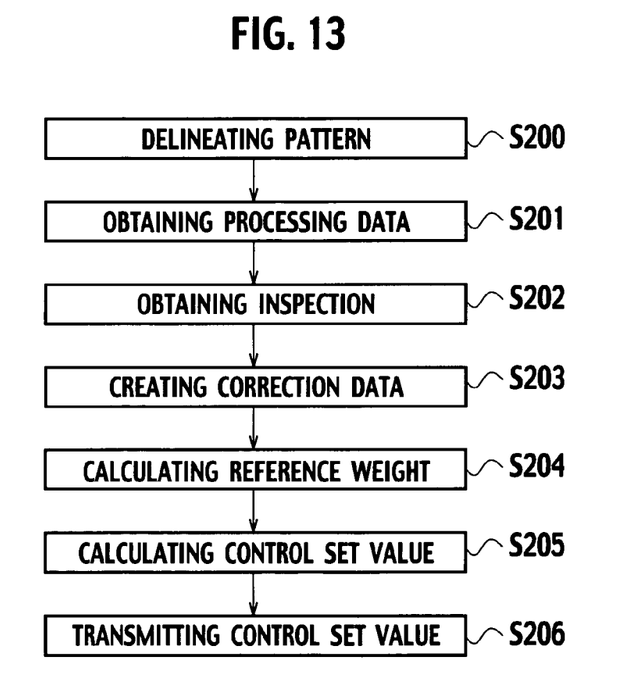
FIG. 13 is a flowchart showing an example of a method for controlling an overlay according to the second embodiment of the present invention.
Figure 14:
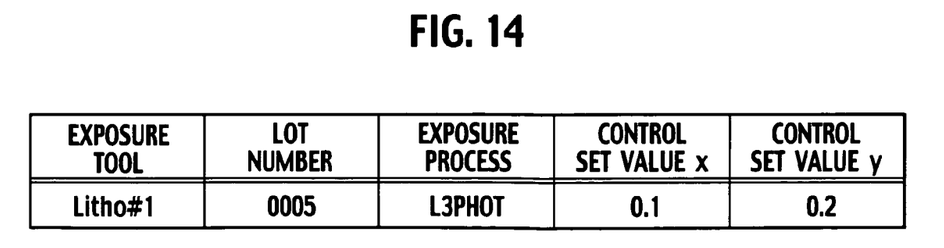
FIG. 14 is a view showing an example of processing data according to a modification of the second embodiment of the present invention.

Next, a method for controlling an overlay according to the second embodiment of the present invention will be described with reference to the flowchart shown in FIG. 13. The manufacture of a semiconductor device using a semiconductor substrate (reference semiconductor substrate) of the lot number 0005 is carried out following the manufacturing processes shown in the FIG. 2.

In step S200, the L3 exposure process is carried out using the exposure tool 50, to delineate a pattern of the layer L3. The processing data string shown in FIG. 4 is received from the exposure tool 50 by the processing data receiving module 30 of the control unit 10a, shown in FIG. 11, and stored in the processing information database 12 at the end of the L3 exposure process.

In step S201, the L2L3 inspection process is carried out using the overlay inspection tool 52 to inspect the overlay between the layers L2 and L3. The L1L3 inspection process is carried out using the overlay inspection tool 52 to inspect the overlay between the layers L1 and L3. The inspection data strings shown in FIG. 5 are received from the overlay inspection tool 52 by the inspection data receiving module 32 and stored in the inspection information database 14 at the end of each of the L2L3 and L1L3 inspection processes.

In step S202, the combination information database 16 that stores the combining condition table defining the relations between the exposure process and the inspection process, shown in FIG. 6, is searched by the data combining module 33 for the inspection process names L2L3OL and L1L3OL received by the inspection data receiving module 32, to obtain the exposure process name L3PHOT. The processing information database 12 and the inspection information database 14 are searched, respectively, for the lot number 0005, and the exposure process name L3PHOT and the inspection process names L2L3OL, L1L3OL. The obtained processing and inspection data strings are combined, by the data combining module 33, so as to create the correction data table shown in FIG. 7 and to store in the correction information database 18.

In step S103, the combination information database 16 is searched, by the data searching module 34, for the exposure process name L3PHOT to obtain the inspection process names L2L3OL, L1L3OL. The correction information database 18 is searched for the inspection process names L2L3OL, L1L3OL to obtain the correction data table.

In step S204, the reference information database 19 is searched, by the reference weight calculation module 35, for the inspection process names L2L3OL, L1L3OL to obtain the reference table. The inspection values of the L2L3 and L1L3 inspection processes described in the correction data table are weighted by the reference weights as calculated based on the reciprocals of the L2L3 and L1L3 reference values described in the reference table, respectively.

In step S205, the corrected control set value is calculated, by the control set value calculation module 36, based on the control set value of the L3 exposure process described in the correction data table, and the weighted inspection values by the reference weights.

In step S206, the corrected control set value is transmitted to the exposure tool 50 by the transmission module 38. Using the corrected control set value, the L3 exposure process using a semiconductor substrate (target semiconductor substrate) of the next lot is carried out by the exposure tool 50.

In the method for controlling an overlay according to the second embodiment, the corrected control set value of the L3 exposure process of the next lot is calculated based on the inspection values of the L2L3 and L1L3 inspection processes, which are weighted by the reference weights calculated by the reciprocals of the L2L3 and L1L3 reference values, respectively. As a result, it is possible to ensure the overlay accuracy of the pattern of the transferred layer to the underlying layer corresponding to the reference value of the guaranteed overlay accuracy.

Further, in the second embodiment, the reference weight is calculated using the reciprocal of the reference value of the guaranteed overlay accuracy. However, the reference weight calculation is not so limited. For example, a reference weight may be calculated using an exponential of a reciprocal of the reference value. By using the exponential of the reciprocal of the reference value, it is possible to further increase a reference weight between layers having a smaller reference value, and to increase the overlay accuracy with respect to the underlying layer.

Modification of Second Embodiment

Figure 15:
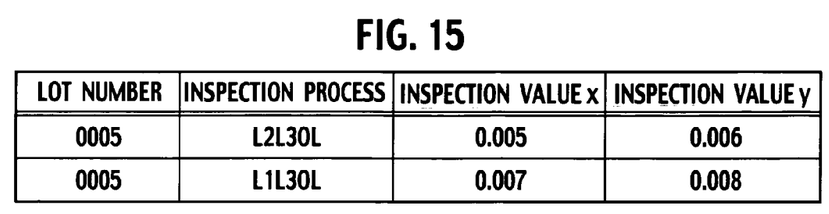
FIG. 15 is a view showing an example of inspection data according to the modification of the second embodiment of the present invention.
Figure 16:
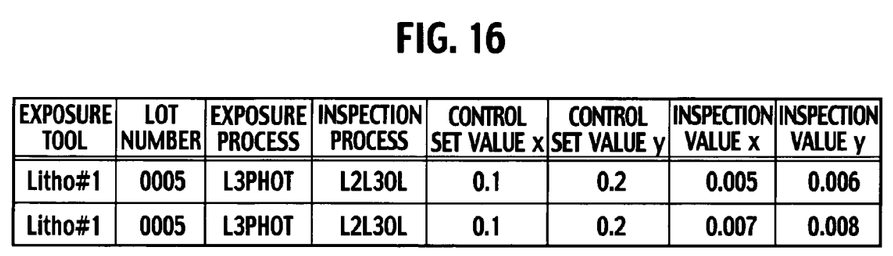
FIG. 16 is a view showing an example of correction data according to the modification of the second embodiment of the present invention.

In a method for controlling an overlay according to a modification of the second embodiment of the present invention, a pattern of a transferred layer is defined by different overlay accuracies in the X and Y directions in an underlying layer. For example, control set values x and y of the X and Y directions are described as "0.1" and "0.2", respectively, in the processing data string stored in the processing information database 12, shown in FIG. 11. As shown in FIG. 15, the control set values x and y are described as "0.005" and "0.006" with respect to the inspection process name L2L3OL, and as "0.007" and "0.008" with respect to the inspection process name L1L3OL, respectively, in the processing data string stored in the inspection information database 14. As shown in FIG. 16, the exposure process name, the inspection process name, the control set value of the X and Y directions, the inspection value of the X and Y directions, and the like, are combined and described in the correction data table stored in the correction information database 18.

Figure 17:
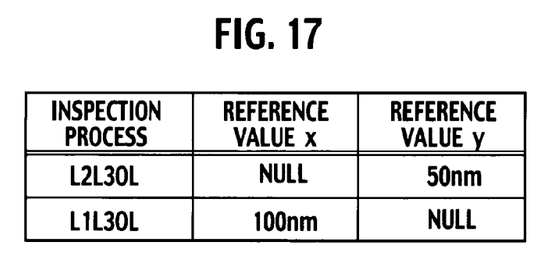
FIG. 17 is a view showing an example of a reference table according to the modification of the second embodiment of the present invention.

As shown in FIG. 17, reference values x and y of the X and Y directions are described as "null" and "50 nm", with respect to the inspection process name "L2L3OL", and as "100 nm" and "null" with respect to the inspection process name "L1L3OL", respectively, in the reference table stored in the reference information database 19. Here, the reference value "null" indicates that there is no need to consider overlay accuracy between layers.

Figure 18:
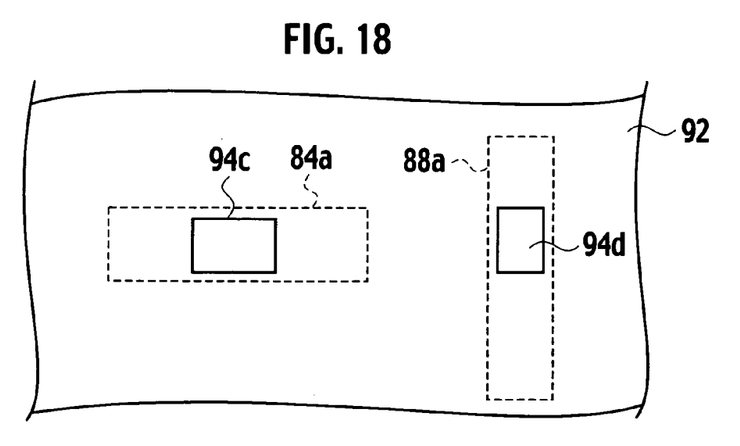
FIG. 18 is a plan view showing an example of overlay control according to the modification of the second embodiment of the present invention.

For example, as shown in FIG. 18, openings 94c and 94d of the layer L3, formed in the resist 92, are overlaid to a first pattern 84a of the layer L1 and a second pattern 88a of the layer L2, respectively. A length in the X direction of the first pattern 84a in the layer L1 is longer than two times the maximum shift in the X direction of the opening 94c by the L3 exposure process. A length in the Y direction of the second pattern 88a, formed in the layer L2, is longer than two times the maximum shift in the Y direction of the opening 94d by the L3 exposure process. Therefore, with respect to the X direction of the first pattern 84a, and the Y direction of the second pattern 88a, a guaranteed overlay accuracy does not need to be defined.

The method for controlling an overlay according to the modification of the second embodiment is different from the second embodiment in which the pattern of the transferred layer is defined by different overlay accuracies in the X and Y directions of the underlying layer. Other configurations of the modification of the second embodiment are similar to the second embodiment, so duplicated descriptions are omitted.

In the modification of the second embodiment, overlay accuracies of 50 nm for the Y direction and 100 nm for the X direction are respectively ensured with respect to the L2L3 overlay and the L1L3 overlay in the L3 exposure process. For example, the L2L3 reference values in the X and Y directions are denoted as jx and jy, the L1L3 reference value in the X and Y directions are denoted as kx and ky, and summations of the reference values in the X and Y directions are denoted as sx and sy, respectively.

$$sx = jx + kx \qquad (8)$$

$$sy = jy + ky \qquad (9)$$

Reference weights Wax, Wbx, Way, and Wby in the X and Y directions with respect to the inspection values of the L2L3 and L1L3 overlays, respectively, are defined by the following equations.

$$Wax = sx/jx, \text{ but if } jx = \text{"null"}, Wax = 0 \qquad (10)$$

$$Way = sy/jy, \text{ but if } jy = \text{"null"}, Way = 0 \qquad (11)$$

$$Wbx = sx/kx, \text{ but if } kx = \text{"null"}, Wbx = 0 \qquad (12)$$

$$Wby = sy/ky, \text{ but if } ky = \text{"null"}, Wby = 0 \qquad (13)$$

Summations Sx and Sy of the reference weights in the X and Y directions are defined as follows.

$$Sx = Wax + Wbx \qquad (14)$$

$$Sy = Way + Wby \qquad (15)$$

A virtual inspection value Dx in the X direction is provided by the following equation, using the inspection value Ax of the L2L3 inspection process and the inspection value Bx of the L1L3 inspection process, respectively, in the X direction.

$$Dx = (Ax \times Wax + Bx \times bx)/Sx \qquad (16)$$

A virtual inspection value Dy in the Y direction is provided by the following equation, using the inspection value Ay of the L2L3 inspection process and the inspection value By of the L1L3 inspection process, respectively, in the Y direction.

$$Dy = (Ay \times Way + By \times Wby)/Sy \qquad (17)$$

Corrected control set values Ex and Ey in the X and Y directions are calculated based on the inspection values Dx, Dy using the following equation.

$$Ex = Cx - Dx \qquad (18)$$

$$Ey = Cy - Dy \qquad (19)$$

Here, Cx and Cy are denoted as the control set values in the X and Y directions used in the L3 exposure process.

For example, using the equations (8) through (17) with the correction data table shown in FIG. 16 and the reference table shown in FIG. 17, the virtual inspection values Dx and Dy are respectively calculated as being about 0.007 and about 0.005. Using the equations (18) and (19), the corrected control set values Ex and Ey are respectively calculated as being about 0.093 and about 0.095. The corrected control set value is transmitted back to the exposure tool 50 and the manufacturing process for a semiconductor device of the next lot is carried out.

Thus, in the modification of the second embodiment, the inspection values Ax, Ay, Bx, and By of the L2L3 and L1L3 overlays are weighted by the reference weights calculated, based on the reciprocals of the L2L3 reference values jx and jy, and the L1L3 reference values kx and ky, respectively. Therefore, it is possible to increase the overlay accuracy between the layers L1 and L3 in the Y direction, which have smaller reference values. In this manner, in the method for controlling an overlay according to the modification of the second embodiment, it is possible to ensure the overlay accuracy of the pattern of the transferred layer to the underlying layer corresponding to the reference value of the guaranteed overlay accuracy in each of the X and Y directions.

Other Embodiments

In the first and second embodiments of the present invention, the layers L1 and L2 are identified as the underlying layers to which the overlay inspections are carried out. However, the number of underlying layers is not limited. For example, when carrying out a plurality of overlay inspections corresponding to a plurality of underlying layers, a plurality of inspection values are obtained. Additionally, a plurality of reference values are prepared in the reference table corresponding to the plurality of underlying layers. Using the plurality of inspection values and the plurality of reference values, the corrected control set value is calculated by the equation (2) or the equations (18) and (19).

The present invention has been described as mentioned above. However the descriptions and drawings that constitute a portion of this disclosure should not be perceived as limiting this invention. Various alternative embodiments and operational techniques will become clear to persons skilled in the art from this disclosure.

What is claimed is:

1. A method for manufacturing a semiconductor device, comprising:
   sequentially delineating a plurality of underlying patterns of underlying layers below a target layer on a reference semiconductor substrate;
   inspecting an overlay between the target layer and each of the underlying layers;
   providing a corrected control set value by:
      obtaining a processing data string describing a name of an exposure process for the target layer and an original control set value of overlays by an exposure tool between a target pattern in the target layer and the underlying patterns in the underlying layers;
      obtaining a plurality of inspection data strings describing a plurality of names of a plurality of inspection processes and a plurality of inspection values determined by the inspection processes, the inspection processes inspecting respective overlays between the target and the underlying patterns;
      creating a correction data table by combining the processing data string and each of the inspection data strings using a combining condition table, the combining condition table describing a relationship between the exposure process and each of the inspection processes; and
      calculating the corrected control set value of the exposure tool based on the inspection values of the correction data table;
   sequentially delineating the underlying patterns in respective underlying layers on the target semiconductor substrate; and
   transferring a pattern of the target layer onto the target semiconductor substrate by the exposure tool, using the corrected control set value.

2. The method of claim 1, further comprising:
calculating a reference weight of each of the inspection values based on each of reference values of overlay accuracy between the target layer and each of the underlying layers, by obtaining the reference values using the reference table which defines the overlay accuracy between the target layer and each of the underlying layers;
wherein the corrected control set value is calculated based on the reference weight and the inspection values.

3. The method of claim 1, wherein the corrected control set value is calculated based on the original control set value and an average of the inspection values.

4. The method of claim 2, wherein the reference weight is calculated using a summation of the reference values and a reciprocal of each reference value.

5. The method of claim 2, wherein the reference weight is calculated using a summation of the reference values and an exponential of a reciprocal of each reference value.

6. The method of claim 2, wherein the corrected control set value is calculated with respect to a first direction in a plane of each of the underlying layers and a second direction orthogonal to the first direction, respectively.

7. A system for controlling an overlay, comprising:
   a processing data receiving module configured to receive a processing data string from an exposure tool, the processing data string describing a name of an exposure process for a target layer and an original control set value of overlays between a target pattern in the target layer and underlying patterns in a plurality of underlying layers below the target layer;
   an inspection data receiving module configured to receive a plurality of inspection data strings from an overlay inspection tool, the inspection data strings describing a plurality of names of a plurality of inspection processes and a plurality of inspection values determined by the inspection processes, the inspection processes inspecting respective overlays between the target pattern and the underlying patterns;
   a data combining module including a combining condition table configured to combine the processing data string and each of the inspection data strings so as to create a correction data table, the combining condition table describing a relationship between the exposure process and each of the inspection processes; and
   a control set value calculation module configured to calculate a corrected control set value based on the inspection values of the correction data table.

8. The system of claim 7, further comprising:
a processing information database in which the processing data receiving module stores the processing data string;
an inspection information database in which the inspection data receiving module stores the inspection data strings;
a combination information database configured to store the combining condition table;

a correction information database in which the data combining module stores the correction data table; and a reference information database configured to store a reference table which defines overlay accuracy between the target layer and each of the underlying layers.

9. The system of claim 7, wherein the control set value calculation module calculates the corrected control set value using the original control set value and an average of the inspection values of the correction data table.

10. The system of claim 8, further comprising a reference weight calculation module configured to calculate a reference weight of each of the inspection values based on each of reference values of the overlay accuracy between the target layer and each of the underlying layers, by searching the reference table in the reference information database so as to obtain the reference values.

11. The system of claim 10, wherein the reference weight calculation module calculates the reference weight using a summation of the reference values and a reciprocal of each reference value.

12. The system of claim 10, wherein the reference weight calculation module calculates the reference weight using a summation of the reference values and an exponential of a reciprocal of each reference value.

13. The system of claim 10, wherein the control set value calculation module calculates the corrected control set value using the reference weights and the inspection values of the correction data table.

14. A method for controlling an overlay, comprising:

sequentially delineating a plurality of underlying patterns of underlying layers below a target layer;

obtaining a processing data string from a processing information database, the processing data string describing a name of an exposure process for the target layer and an original control set value of overlays by an exposure tool between a target pattern in the target layer and the underlying patterns in the underlying layers;

obtaining a plurality of inspection data strings from an inspection information database, the inspection data strings describing a plurality of names of a plurality of inspection processes and a plurality of inspection values determined by the inspection processes, the inspection processes inspecting respective overlays between the target pattern and the underlying patterns;

creating a correction data table by combining the processing data string and each of the inspection data strings using a combining condition table, the combining condition table describing a relationship between the exposure process and each of the inspection processes; and calculating a corrected control set value of the exposure tool based on the inspection values of the correction data table.

15. The method of claim 14, further comprising:

calculating a reference weight of each of the inspection values based on each of reference values of overlay accuracy between the target layer and each of the underlying layers, by obtaining the reference values using the reference table which defines the overlay accuracy between the target layer and each of the underlying layers;

wherein the corrected control set value is calculated based on the reference weight and the inspection values.

16. The method of claim 14, wherein the corrected control set value is calculated based on the original control set value and an average of the inspection values.

17. The method of claim 15, wherein the corrected control set value is calculated using a product of each of the inspection values and each of the reference weights corresponding to each of the inspection values.

18. The method of claim 15, wherein the reference weight is calculated using a summation of the reference values and a reciprocal of each reference value.

19. The method of claim 15, wherein the reference weight is calculated using a summation of the reference values and an exponential of a reciprocal of each reference value.

20. The method of claim 15, wherein the corrected control set value is calculated with respect to a first direction in a plane of each of the underlying layers and a second direction orthogonal to the first direction, respectively.

* * * * *